(12) United States Patent
Younis et al.

(10) Patent No.: US 6,184,812 B1
(45) Date of Patent: Feb. 6, 2001

(54) METHOD AND APPARATUS FOR ELIMINATING CLOCK JITTER IN CONTINUOUS-TIME DELTA-SIGMA ANALOG-TO-DIGITAL CONVERTERS

(75) Inventors: Saed G. Younis; Daniel Keyes Butterfield, both of San Diego, CA (US)

(73) Assignee: Qualcomm Incorporated, San Diego, CA (US)

( * ) Notice: Under 35 U.S.C. 154(b), the term of this patent shall be extended for 0 days.

(21) Appl. No.: 09/211,716

(22) Filed: Dec. 14, 1998

(51) Int. Cl.$^7$ .................................................. H03M 3/00
(52) U.S. Cl. ............................................................ 341/143
(58) Field of Search .................................... 341/143, 133, 341/150, 172

(56) References Cited

U.S. PATENT DOCUMENTS

| | | | | |
|---|---|---|---|---|
| 5,754,131 | * | 5/1998 | Ribner et al. ......................... | 341/143 |
| 5,870,048 | * | 2/1999 | Kuo et al. ............................. | 341/143 |
| 6,040,793 | * | 3/2000 | Ferguson, Jr. et al. .............. | 341/143 |

OTHER PUBLICATIONS

Article—"An Overview of Sigma Delta Converters", by Aziz et al., IEEE Signal Processing Magazine, Jan. 1996—pp. 61–84.

* cited by examiner

Primary Examiner—Brian Young
(74) Attorney, Agent, or Firm—Phillip Wadsworth; Charles D. Brown; Bruce Greenhaus

(57) ABSTRACT

An inventive high-resolution Delta-Sigma analog-to-digital converter using a Continuous-Time implementation having suppressed sensitivity to clock jitter. The inventive method and apparatus suppresses the sensitivity to jitter by the square of the oversampling ratio when compared to current Continuous-Time implementations of Delta-Sigma modulators. The present invention eliminates the clock jitter disadvantage between sampled-data and Continuous-Time implementations of Delta-Sigma modulators. The present invention preferably includes a digital-to-analog converter that ensures that the integral of an output voltage is constant over a clock duty cycle regardless of clock jitter. The digital-to-analog converter preferably includes at least two switches and a capacitor. A first switch is used to charge the capacitor and a second switch is used to discharge the capacitor. Each switch is controlled by a clock phase wherein the sum of the two phases equals the clock duty cycle.

40 Claims, 2 Drawing Sheets

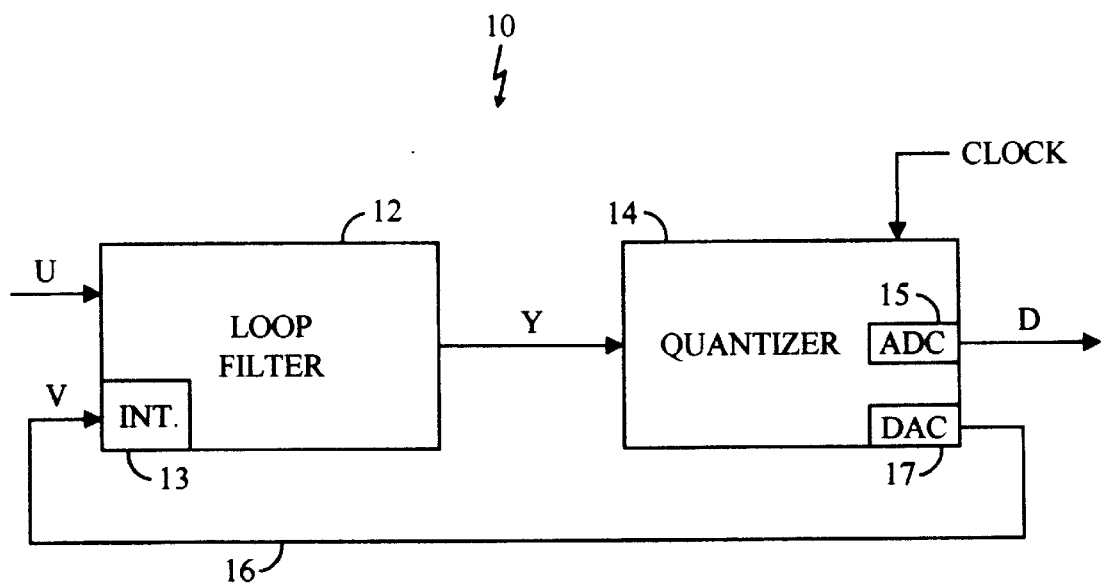
FIG. 1 - PRIOR ART
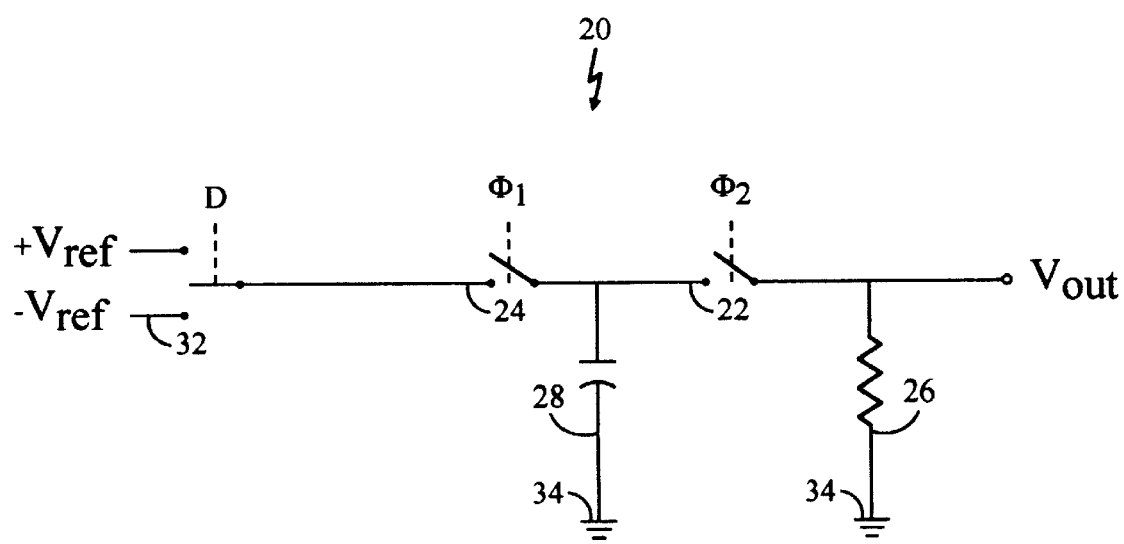
FIG. 2

METHOD AND APPARATUS FOR ELIMINATING CLOCK JITTER IN CONTINUOUS-TIME DELTA-SIGMA ANALOG-TO-DIGITAL CONVERTERS

BACKGROUND OF THE INVENTION

1. Field of the Invention

This invention relates to methods and apparatus for eliminating clock jitter in Delta-Sigma, Analog-to-Digital Converters, and more particularly methods and apparatus for eliminating clock jitter in Continuous-Time Delta-Sigma Analog-to-Digital Converters.

2. Description of Related Art

Recently there has been a rapid rise in the use of Delta-Sigma analog-to-digital converters. They are capable of high-resolution data conversion without need for tight component matching or trimming of components. Because Delta-Sigma A/D converters are insensitive to a wide range of component non-idealities present in situations where they are implemented, high resolution sampling with relaxed component specifications is obtained by employing a single-bit digital-to-analog (DAC) inside a noise-shaping loop. The noise-shaping loop operates at a sampling rate that is typically much higher than the Nyquist rate of the data that is sampled. This causes sampling and component noise to be pushed to bands that are outside the band of interest. A paper by C. Candy and G. C. Temes, entitled "Oversampling methods for A/D and D/A conversion," in Oversampling Delta-Sigma Data Converters, and published by IEEE Press, 1991, on pages 1–25 describes such converters and is incorporated by reference for its teachings on such. Due to the oversampling performed by Delta-Sigma converters, they typically require a simple anti-aliasing filter at their input.

Many Delta-Sigma converters available and in commercial use today are Switched-Capacitor ("SC") implementations. Delta-Sigma converters are commonly employed as modulators. In the simplest case, a modulator may comprise a single Delta-Sigma converter. SC converter designs are used because the design and simulation of SC filters is well understood. Consequently, SC filters may be easily integrated into a design. However, because the capacitors employed in SC Delta-Sigma converter loops sample continuous valued voltage levels SC implementations require highly linear floating capacitors. In addition, both leads of these SC capacitors are generally switched during operation. These characteristics of SC designs complicate the manufacture of SC converters because the need for high linearity floating capacitors usually necessitates a double-poly manufacturing process.

In order to overcome these shortcomings, a new methodology called Switch-Current ("SI") has emerged as an alternative to SC designs for implementing sampled analog converter designs. SI designs are described in the following references: a paper by T. S. Fiez and D. S. Allstot, entitled "CMOS Switched-Current Ladder Filters," published in IEEE J. of Solid-State Circuits, Vol. 25, No.6. December 1990, on pages 1360–1366; a paper by J. B. Hughes, N. C. Bird, and I. C. Macbeth, entitled "Switched Currents: A New Technique for Analog Sampled-Data Signal Processing," published in Proceedings of the IEEE International Symposium on Circuits and Systems, May 1989, on pages 1584–1587; and a paper by J. B. Hughes and K. W. Moulding, entitled "S-I: A Two-Step approach to Switched-Currents," published in the Proceedings of IEEE International Symposium on Circuits and Systems, 1993 on pages 1235–1238. These papers are hereby incorporated by reference for their teachings on SI designs. SI implementations advantageously can be at reduced implemented cost using standard CMOS processes. However, SI implementations have not yet achieved the same performance levels that have been achieved by the SC designs. Both SC and SI circuit implementations are examples of sampled-data systems. In a sampled-data system, a number of analog switches toggle at the rising edge of a clock signal. The sampled-data circuit is then given sufficient time to settle sampled voltages according to the circuit's switched topology. As a consequence, all voltages and currents are static in-between clock pulses in a sampled-data system.

An alternative to sampled-data systems is "Continuous-Time" ("CT") systems. In CT systems, sampling is performed at the converter output. As a consequence, the circuit nodes in the system operate in a CT mode. The implementation of Delta-Sigma modulators using the CT design approach advantageously performs sampling operations inside the modulator loop. Accordingly, sampling errors and out-of-band signals that alias into the passband are suppressed by the high gain of the loop in the passband. This advantageous effect is described in a paper by J. Schreier and B. Zhang, entitled "Delta-Sigma Modulators Employing Continuous-Time Circuitry," published in EEE Transactions on Circuits and Systems-I: Fundamental Theory and Applications," Vol. 43, No.4, April 1996, on pages 324–332, which is incorporated by reference for its teachings on CT Delta-Sigma Modulators.

The above described effect is particularly important for passband or bandpass Delta-Sigma modulators where the input signal is varying at a rate close to or higher than the sampling rate. Bandpass modulators have become more frequently employed in IF sampling receivers. Further, because of their continuous nature of operation, CT circuits advantageously use relatively low power bandwidth amplifiers to achieve the same performance as SC and SI circuits. As a consequence, CT Delta-Sigma modulator circuits may have lower power consumption due to relatively low amplifier bias currents.

Despite these advantages, two obstacles have impeded the use of CT circuits in Delta-Sigma modulator implementations. The first obstacle is that CT circuits are much more difficult to design and simulate than are SC and SI circuits. The second obstacle is that CT circuits are orders of magnitude more susceptible to clock jitter than are SC and SI circuits. With regard to the first obstacle, recently there has been significant research into the development of tools that map simulation results for sampled-data systems (such as SC & SI circuits) to their CT counterparts. In addition, CT simulations, although tedious and time consuming, are routinely performed by designers of ICs that implement CT RF, or base band filters. Therefore, the first obstacle is not an absolute deterrent against the use of CT Delta-Sigma designs.

The second obstacle, the susceptibility to clock jitter, is much more critical and has not yet been traversed by previous designs. The CT circuit's sensitivity to clock jitter has been a serious barrier against CT implementation of Delta-Sigma converters employed in modulators as noted in the following references: a paper by O. Shoaei and M. Snelgrove, entitled "Optimal (Bandpass) Continuous-Time Sigma-Delta Modulator." published in the Proceedings of the IEEE international Symposium on Circuits and Systems, Vol. 5, May 30–Jun. 2, 1994, on pages 489–492; the Ph.d Thesis of L. Williams for the University of California, Berkeley, 1993 on pages 71–74; and in the Masters Thesis of N. Wongkomet, entitled "A Comparison of Continuous-Time and Discrete-Time Sigma-Delta Modulators," for the University of California on pages 13–17. These references are incorporated by reference for their teachings on CT circuits and implementations.

In contrast to CT implementations, in sampled-data implementations clock jitter affects only the sampling capacitors at the front-end of the modulator. Once signals are sampled by these capacitors, clock jitter has no further effect in the sampled-data systems. This is due in part because the clock period in sampled-data systems is much longer than the required settling time. Hence, clock jitter effects for sampled-data systems may be modeled as modulation of input signals due to nonuniform sampling. Assuming the effects of clock jitter to be uncorrelated with the input signal and that the effects have a white noise spectrum, the clock jitter in a sampled-data system generates a white noise component that is added to the sampled signal. Due to an oversampling ratio ("OSR"), however, the noise caused by the clock jitter in the band of interest is attenuated.

In contrast, in CT implementations, clock jitter substantially adversely affects the operation of CT circuits. In contrast to the sampled-data designs, in CT circuits, the feedback DAC is implemented as a current source that is gated by the clock. In most Delta-Sigma modulator topologies, the signal from the DAC is subtracted from the input signal and thereafter a first integrator in the circuit integrates the result. As a consequence, in CT implementations, clock jitter generates a non-uniform ON-Time in the current source. The current source is directly summed with the input signal and is therefore, indistinguishable from the input signal. Assuming a spectrally "white" clock jitter, the noise added by the current source is proportional to the OSR because during every clock cycle an uncorrelated amount is added to the input signal. Therefore, the clock jitter tolerances for CT systems must be better than that of sampled-data systems by approximately the square of the OSR (e.g. –1000 for a typical OSR of 32). This results in clock jitter tolerances and specifications that are not easily achievable in most systems. Thus, a need exists for an apparatus and method that reduces or eliminates the deleterious effects of clock jitter on CT Delta-Sigma converters and the modulators employing the converters. In particular, a need exists for an apparatus and method that reduces the effects of clock jitter in CT implementations to levels comparable to those in sampled-data implementations. The present invention provides such an apparatus and methods.

SUMMARY OF THE INVENTION

The present invention includes a novel method and apparatus for generating an analog signal "V" as a function of a received digital signal "D" and a clock signal having a first and a second phase. The apparatus includes a capacitor coupled to a ground and a first, two-position switch coupled to the capacitor and a second, two-position switch coupled to the capacitor. The first switch receives an analog reference signal that is generated as a function of the digital signal D and charges the capacitor with the analog reference signal during the first phase of the clock signal. The second switch generates the analog signal V by discharging the capacitor during the second phase of the clock signal.

In one embodiment, the apparatus may include a resistor coupled to the second switch and a ground. In this embodiment, the capacitor is discharged across the resistor during the second phase of the clock signal. In another embodiment, the apparatus may include a transconductor coupled to the second switch. In this embodiment, the capacitor is discharged across the transconductor during the second phase of the clock signal. Further, in both embodiments, the apparatus may include a dipole switch coupled to the first switch. The dipole switch receives a first analog signal and a second analog signal and supplies one of the first and the second analog signals as the analog reference signal to the first switch based on the value of the digital signal D.

The first analog signal, the second analog signal, and the analog reference signal may be voltages. In addition, the digital signal D may be a single bit binary signal having two possible values. Further, the magnitude of the first analog signal may be equal to the magnitude of the second analog signal.

The present invention also includes a novel continuous-time, Delta-Sigma, analog-to-digital converter for generating a digital signal, "D" as a function of an analog signal, "U" and a clock signal having a first and a second phase. The converter includes a loop filter capable of receiving the analog signal U and an analog feedback signal "V". In this embodiment, the loop filter generates an analog difference signal Y wherein the difference signal Y is equal to the difference between the analog signal U and the analog feedback signal V. The converter also includes a quantizer capable of receiving the analog difference signal Y. The quantizer generates the digital signal D as a function of the analog difference signal Y. In one embodiment, the quantizer includes a capacitor coupled to a ground, a first, two-position switch coupled to the capacitor and a second, two position switch also coupled to the capacitor. The first two-position switch receives an analog reference signal that is generated as a function of the digital signal D. The capacitor is charged with the analog reference signal during the first phase of the clock signal. The second two-position switch generates the analog feedback signal V by discharging the capacitor during the second phase of the clock signal.

In one embodiment of the present invention, the converter may also include a resistor coupled to the second switch and a ground. In this embodiment, the capacitor is discharged across the resistor during the second phase of the clock signal. In another embodiment, the converter may include a transconductor that is operatively coupled to the second switch. In this embodiment, the capacitor is discharged across the transconductor during the second phase of the clock signal. Further, in both embodiments, the converter may include a dipole switch coupled to the first switch. The dipole switch receives a first analog level signal and a second analog level signal and supplies one of the first and the second analog level signals as the analog reference signal to the first switch based upon the value of the digital signal D.

Similar to the embodiment described above, the first analog level signal, the second analog level signal, and the analog reference signal may be voltage signals. In addition, the digital signal D may be a single bit binary signal having two values. Further, the magnitude of the first analog level signal may be equal to the magnitude of the second analog level signal. The loop filter of the converter may also include at least one integrator wherein the integrator receives the analog feedback signal V.

The present invention also includes a novel method of generating an analog signal V as a function of a received digital signal D and a clock signal having a first and a second phase. The method includes generating an analog reference signal as a function of the digital signal D. Further, the method includes charging a capacitor with the analog reference signal during the first phase of the clock signal. The method also includes generating the analog signal V by discharging the capacitor during the second phase of the clock signal.

In one embodiment of the present inventive method, the step of generating the analog signal V may include discharging the capacitor across a resistor during the second phase of the clock signal. In another embodiment, the step of generating the analog signal V may include discharging the capacitor across a transconductor during the second phase of the clock signal. In both embodiments, the step of generating the analog reference signal may include receiving a first analog level signal and a second analog level signal and supplying one of the first and the second analog level signals as the analog reference signal based upon the value of the digital signal D. Similar to the apparatus and converter described above, the first analog level signal, the second analog level signal, and the analog reference signal may be voltage signals. Further, the digital signal D may be a single bit binary signal having two values and the magnitude of the first analog level signal may be equal to the magnitude of the second analog level signal.

The present invention further includes a novel method of generating a digital signal, D, as a function of an analog signal, U, and a clock signal having a first and a second phase. This method includes a step of receiving the analog signal U and an analog feedback signal V and generating an analog difference signal Y, wherein the difference signal Y is equal to the difference between the analog signal U and the analog feedback signal V. The method also includes the step of receiving the analog difference signal Y and generating the digital signal D as a function of the analog difference signal Y. The method further includes the step of generating an analog reference signal as a function of the digital signal D. In addition, the method includes charging a capacitor with the analog reference signal during the first phase of the clock signal. Finally, the method includes the step of generating the analog feedback signal V by discharging the capacitor during the second phase of the clock signal.

The details of the preferred and alternative embodiments of the present invention are set forth in the accompanying drawings and the description below. Once the details of the invention are known, numerous additional innovations and changes will be obvious to one skilled in the art.

BRIEF DESCRIPTION OF THE DRAWINGS

FIG. 1 shows a block diagram of an exemplary prior art CT Delta-Sigma circuit suitable for use with the present invention.

FIG. 2 shows one embodiment of the present invention realized as a discrete component implementation of a circuit that may be employed as a digital-to-analog (DAC) of a quantizer of a CT Delta-Sigma circuit such as the CT Delta-Sigma of FIG. 1.

Like reference numbers and designations in the various drawings indicate like elements.

DETAILED DESCRIPTION OF THE INVENTION

Figure 3:
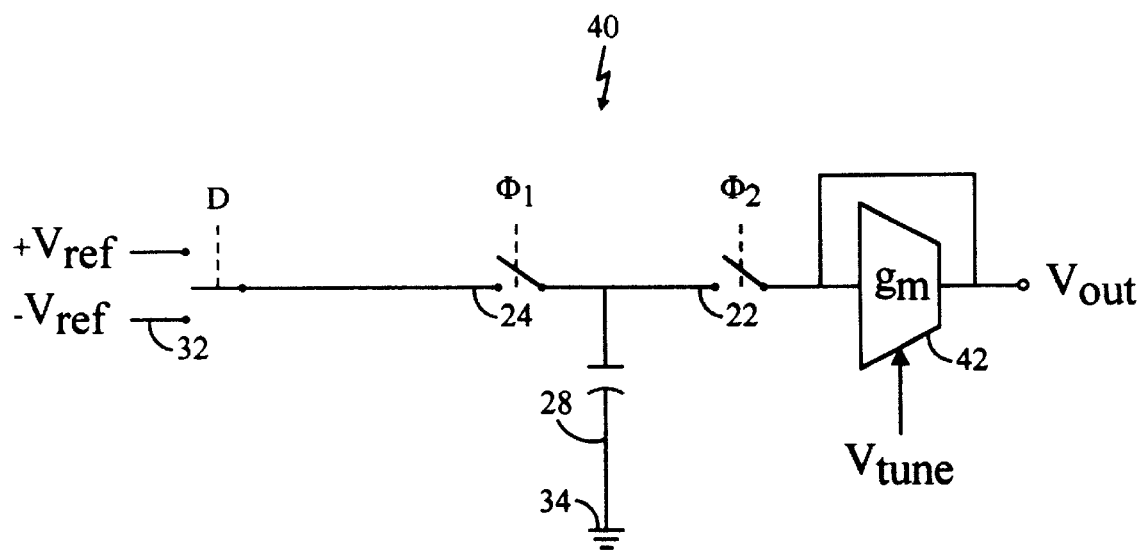
FIG. 3 shows an alternative embodiment of the present invention realized as an integrated component implementation of a circuit that may be employed as the DAC of the quantizer of a CT Delta-Sigma circuit such as the circuit shown in FIG. 1.

Throughout this description, the preferred embodiment and examples shown should be considered as exemplars, rather than as limitations on the present invention.

Continuous-Time ("CT") Delta-Sigma modulators or converters may be separated into two groups: "single-quantizers" and "multiple quantizers". In general, single-quantizers include a single feedback loop with a single stream of digital output. Multiple or Multi-quantizer Delta-Sigma converters include a cascade of single loop modulators, each modulator having its own quantizer. Advantageously, the present invention may be utilized by both single-quantizer and multiple-quantizer modulators that employ CT circuitry. For the sake of simplicity, the present invention is described herein as applied to single-quantizer architectures only. However, those skilled in the Delta-Sigma converter art will appreciate that the present invention may also be applied to multi-quantizer architectures. An exemplary model of a single-quantizer Delta-Sigma analog-to-digital converter in which the present invention is utilized is shown in FIG. 1.

As shown in FIG. 1, the modulator 10 includes a loop filter 12, a quantizer 14, and an analog feedback loop 16. An analog signal, "U", is processed by the modulator 10 in order to generate a binary digital output signal, "D", based on the difference of U and the previous value of D (which is represented by an analog signal "V"). The loop filter 12 is a 2-input (shown as inputs U and V in FIG. 1) linear network with a transfer function from V to Y and from U to Y. The loop filter 12 determines the difference between V and U and generates a difference signal "Y". The loop filter 12 preferably includes as least one integrator 13.

As shown in FIG. 1, the difference signal Y, which is a continuous-valued analog signal, is input to the quantizer 14 of the modulator 10. The quantizer 14 preferably produces a voltage that is equal to a value from a pre-selected set of values, generates D as a function of the voltage, and generates the analog feedback voltage V on feedback loop 16 as a function of D. The quantizer 14 preferably includes an analog-to-digital converter ("ADC") 15 and a digital-to-analog converter ("DAC") 17. The ADC 15 generates the digital output D which is the digital output of the modulator as a function of the voltage selected from the predetermined set. The DAC 17 receives the output of the ADC 15, D, and produces the analog feedback voltage V as a function of D.

V is set to either $+V_{ref}$ or $-V_{ref}$ as a function of the digital value of D. As shown in FIG. 1, the analog voltage V generated by the D/A converter ("DAC") 17 is passed to the loop filter 12 via feedback loop 16. The analog voltage V is input to at least a summing input of the integrator 13 of the loop filter 12. The analog voltage V may also be input to other nodes. The input signal U is also provided as input to the integrator 13. The output of the integrator 13 is the difference signal Y. For both Sampled-Data and Continuous-Time modulators, the quantizer 14 is a clocked circuit. The output D and V remain static for the duration of the clock period.

In a single-bit modulator D is a single-bit-wide digital data stream. Also, V is an analog signal (voltage or current) which can be one of two levels, $\pm V_{ref}$, based upon the clocked value of D. Sampled-data Delta-Sigma modulators are immune to scaling as well as offset variations of the generation of $\pm V_{ref}$ provided that these variations are static on the time scale of the memory of the input signal. In CT modulators that use switched-current sources to generate V, however, clock jitter directly manifests itself as a signal component of V. To prevent clock jitter from adversely affecting the generation of V in CT modulators, V must be generated in such a manner as not to be dependent upon the duty cycle of the clock. When V is produced using this approach, clock variations or jitter will not become manifest as a signal component of V.

In common loop filters such as that shown in FIG. 1, the analog feedback voltage V always terminates at a summing input of the integrator 13. Consequently, only the integral of the analog feedback signal V over a clock period is important. Thus, only the integral of the feedback signal V must remain static from clock cycle to clock cycle. By taking advantage of this observation, a CT Delta-Sigma modulator that includes a circuit or method for generating a pulsed or feedback signal V having an integral that is constant from clock cycle to clock cycle can be produced. Such a CT Delta-Sigma modulator advantageously is immune to clock jitter.

FIG. 2 is a diagram of a discrete component circuit 20 that can be used to replace the DAC 17 of quantizer 14 of the modulator 10 of FIG. 1. The inventive circuit 20 ensures that the integral of the feedback signal V is constant for each clock cycle. As shown in FIG. 2, circuit 20 preferably includes a dipole switch 32, a first two-position switch 24, a second two-position switch 22, a capacitor 28, a resistor 26, and a plurality of grounds 34. The dipole switch 32 is a two position, dipole switch that causes a signal having a voltage level of either $+V_{ref}$ or $-V_{ref}$ to be input to the circuit 20 as a function of the digital value of D. In some alternative embodiments of the present invention, circuit 20 may be part of the DAC 17 included in the quantizer 14 as described above. In a preferred embodiment, the capacitance of capacitor 28 is about 1 pF, the resistance of resistor 26 is about 25 KOhms, and the voltage of $V_{ref}$ is 1 volt.

The capacitor 28 is charged to $+V_{ref}$ or to $-V_{ref}$ dependent upon the digital bit value of D. Here, D corresponds to the digital output of the quantizer ADC 15 (FIG. 1). In the embodiment shown in FIG. 2, the sampling clock of the modulator 10 has two clock phases "$\Phi_1$" and "$\Phi_2$". It is assumed that D is valid at, or very shortly after, the rising edge of $\Phi_1$. The first switch 24 is controlled as a function of $\Phi_1$ and the second switch 22 is controlled as a function of $\Phi_2$. Consequently, during $\Phi_1$ the capacitor 28 is charged to be equal to one of the reference voltages (either $+V_{ref}$ or $-V_{ref}$). In this embodiment, $\Phi_1$ is made sufficiently long to charge the capacitor 28 to a level beyond which variations in the clock cycle will no longer adversely affect the signal-to-noise-ratio ("SNR") of the modulator 10 (FIG. 1).

During $\Phi_2$, the charge that was stored on capacitor 28 during $\Phi_1$ is discharged through the resister 26 to ground 34. It can be easily seen by those skilled in the art that this produces a pulse on $V_{out}$ having a time integral that is constant regardless of the clock jitter given each level of the reference voltages. As described above, the feedback signal is always provided as input to the summing input of a CT integrator 13 of loop filter 12. CT implementations of Delta-Sigma modulators are either implemented using discrete components or are integrated on an integrated circuit. For integrated circuit implementations, e.g. "$G_m/C$" implementations, the input is a gate of either a Negative-Channel Metal Oxide Semiconductor ("NMOS") or Positive-Channel Metal Oxide Semiconductor ("PMOS") transistor. In such an integrated Delta-Sigma modulators, in order to ensure immunity against capacitive coupling of unwanted signals to this input, the capacitor 28 of FIG. 2 may be made many times larger than the effective capacitance of the input node of the integrator 13. Thus, the resistor 26 is necessary to fully discharge the capacitor 28 from the reference charge to ground. This also ensures that the shape of the waveform of $V_{out}$ is dependent only on the capacitor 28 and the resistor 26 of the DAC 17 of the quantizer 14, and not on parasitics of other components.

Because only the edge of a clock phase initiates the discharging of the capacitor 28 through the resistor 26, and because the phase is sufficiently long to discharge the capacitor 28 to a level below which the SNR of the modulator 10 is unaffected, any error caused by clock jitter through the feedback DAC is vastly reduced or eliminated. Clock jitter may still affect the SNR of the modulator 10 due to non-uniform sampling of the ADC 15 in the quantizer 14. The same distortion may occur in sampled-data implementations. Consequently, CT circuits employing the present invention may have the same sensitivity to clock jitter as their sampled-data counterparts. However, as described above the effects of jitter are attenuated by the oversampling ratio. Regardless, a CT modulator 10 that uses a DAC 20 made in accordance with the present invention will not be affected by clock jitter as significantly as are the current CT circuits that use switched current sources in their feedback loops. As described above, such circuits have increased sensitivity to clock jitter due to the oversampling ratio. Indeed, a CT circuit that uses a DAC 20 made in accordance with the present invention operating at an oversampling ratio of ≅32 has its sensitivity to clock jitter reduced by 1000 fold compared to switch current source designs.

As described above, the loop filter 12 of FIG. 1 may be implemented using discrete components or integrated circuits. In discrete component designs, the summing integrators 13 of the loop filter 12 of modulator 10 (FIG. 1) generally comprise high-speed operational amplifiers having feedback capacitors. By using a sufficiently high open loop gain the input to the integrator 13 is a virtual ground. When the circuit 20 of FIG. 2 is used together with such a discrete implementation of the loop filter 12, the resistor 26 of the discrete component embodiment of the DAC of FIG. 2 may be eliminated because its function is performed by the operational amplifier of the discrete loop filter 12.

FIG. 3 shows an alternative embodiment of the invention wherein the DAC 17 of FIG. 1 is implemented in an integrated circuit design. As shown in FIG. 3, the resistor 26 is replaced with a transconductor 42. As those skilled in the art will appreciate, the transconductor 42 is much smaller and thereby easier to implement in an integrated circuit than is the resistor 26. The DAC 40 of FIG. 3 is identical to the DAC 20 of FIG. 2 provided $1/g_m$ is made equal to the impedance of resistor 26. Ideally, to reduce the effects of process variations, the impedance $g_m$ of the transconductor 42 is dynamically tuned based on $V_{tune}$ as described below with reference to FIG. 4. The current in the block when sunk to ground is equal to $V_{out} * g_m$ due to the high input impedance of the transconductor 42. Therefore, if the value of $1/g_m$ is made equal to the resistance value of the resistor 26 of FIG. 2 the two circuits are for all intensive purposes equivalent, i.e., the transconductance of transconductor 42 is equal to 40 $\mu$Siemens in the preferred embodiment (1/25 Kohms).

While the present inventive method and apparatus has been described using single-bit DAC circuit (e.g., the DAC, 20 and 40 of FIGS. 2 and 3, respectively), the invention is easily extended for use with multi-bit DACs. Multi-bit implementations use more than two reference levels and include a switching network capable of connecting to the correct reference level based upon the multi-bit value of D.

In the case of a multi-bit D value, the linearity of the DAC is not guaranteed due to the difficulty in matching the reference voltage values. A number of techniques have been purposed for producing a very highly linear multi-bit DAC given less than ideal reference voltages. These techniques generally rely on having $2^N$ unity reference voltages where N is equal to the number of bits comprising D. DACs made in accordance with these techniques generate an output signal by summing N of them in a summing amplifier. The perceived high linearity of such DACs is achieved by continuously altering the selected unity voltage node to be summed on a cycle-by-cycle basis. Such techniques of producing highly linear multi-bit DACs are described in the following references: a paper by B. H. Leung and S. Sutarja, entitled "Multibit Z-A Converter Incorporating a Novel Class of Dynamic Element Matching Techniques," published in IEEE Transactions an Circuits and Systems-II: Analog and Digital Signal Processing, Vol. 39, No. 1, January 1992, on pages 35–51; a paper by R. Schreier and B. Zhang, entitled "Noise-Shaped Multi-bit D/A Converter Employing Unit Elements," published in Electronics Letters, Vol. 31, No. 20, September 1995, on pages 1712–1713; a paper by R. T. Baird and T. S. Fiez, entitled "Improved Delta-Sigma DAC Linearity Using Data Weighted Averaging," published in Proceedings of IEEE International Symposium on Circuits and Systems, Seattle, USA 1995, on pages 17–20; and a paper by I. Galton, entitled "Spectral Shaping of Circuit Errors in Digital-to-Analog Converters." These references are incorporated by reference for their teachings on multi-bit DACs. The circuits shown in FIGS. 2 and 3 can use any of these techniques to generate a highly linear, multi-bit DAC for use in CT implementations. One skilled in the DAC art will appreciate that these techniques may be easily included in the topologies of FIGS. 2 and 3. The resultant circuits of FIGS. 2 and 3 yield the same performance improvements as the sampled-data circuits.

Due to tolerance variations inherent to integrated circuits, particularly analog integrated circuits, an adjustment may need to be made to the DACs (20, 40) of FIGS. 2 and 3 to ensure that the time integral of the feedback signal corresponds to the correct value. Although absolute tolerance variations of integrated circuits may be poor, relative tolerance variations are usually fairly good. This is significant because the DACs 20, 40 of FIGS. 2 and 3, respectively, are preferably incorporated into the feedback of a CT Delta-Sigma A/D converter. The loop filter 12 of the Delta-Sigma converter 10 of FIG. 1 may include a plurality of $G_m/C$ integrators. The time constant of the integrators may need adjustment so that the integrators will have unity gain during one period of the quantizer clock. This is routinely done for integrated $g_m/C$ implementations of CT filters as noted in a paper by J. Van der Plas, "MOSPET-C Piker with Low Excess Noise and Accurate Automatic Tuning," published in IEEE Journal of Solid-State Circuits, Vol. SC-26, No. 7, July 1991, on pages 922–929, which is incorporated herein by reference for its teachings of $g_m/C$ adjustment techniques. An exemplary circuit 50 made in accordance with the present invention and used to adjust the value of $g_m$ and thereby achieve the desired integrator time-constant (regardless of process and environment variations) is shown in FIG. 4.

Figure 4:
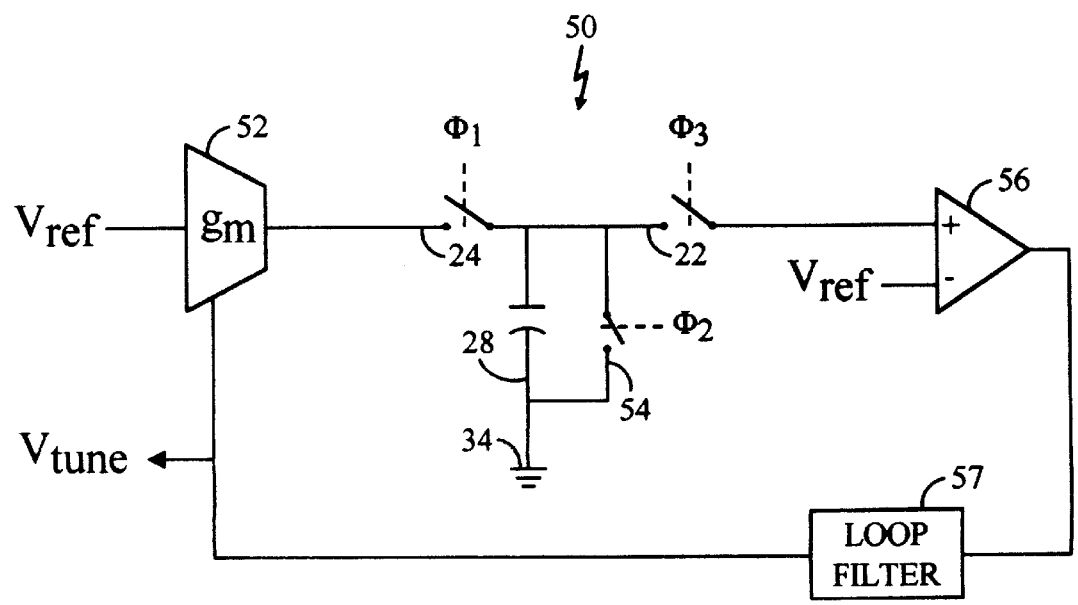
FIG. 4 shows an integrated circuit that may be used with the present invention to automatically determine a voltage, $V_{tune}$, that is input to a transconductor to correct for circuit tolerance variations.

The circuit 50 of FIG. 4 preferably includes a transconductor 52, switches 22, 24, and 54, a capacitor 28, a summing integrator 56 and a loop filter 57. Switches 22, 24, and 54 are preferably individually controlled by clock phases $\Phi_1, \Phi_2$, and $\Phi_3$, respectively, where the clock phases $\Phi_1, \Phi_2$, and $\Phi_3$ are non-overlapping. The width of $\Phi_1$ is preferably equal to the period of the quantizer clock of circuits 20 and 40. In operation, the capacitor 28 is fully discharged during the clock phase $\Phi_2$ and the capacitor 28 is charged back with a current that is equal to $V_{ref} \times g_m$ during the period of $\Phi_1$. At the end of $\Phi_1$, the voltage that is held by the charged capacitor 28 is sampled and compared to a reference voltage, $V_{ref}$ by the summing integrator 56. It is noted that a different reference voltage, $V_{ref2}$ may be input to the summing integrator 56 in other embodiments. The result of this comparison is used to adjust the tuning voltage, $V_{tune}$, such that the final voltage on capacitor 28 at the end of the charging cycle is always equal to $V_{ref}$. The determined tuning voltage $V_{tune}$ is then used to tune all of the $g_m$ blocks of the circuit 50.

Similar to the DAC 20 of FIG. 2, the $g_m$ block of DAC 40 of FIG. 3 requires a tuning voltage. For the DAC 40 of FIG. 3, $g_m$ must be adjusted such that the time integral of the exponential discharge of the capacitor voltage having an initial voltage of $V_{ref}$ is equal to $V_{ref}$. The necessary tuning voltage, $V_{tune}$ of the $g_m$ block in FIG. 3 is, however, identical to the tuning voltage $V_{tine}$. The voltage $V_{tune}$ is used by the other $g_m$ blocks for the loop filter 12 integrators and is produced by the circuit of FIG. 4. Thus, using the same tuning voltage, $V_{tune}$, the DAC 40 of FIG. 3 produces the correct integral value of $V_{out}$ regardless of the process and environment variations.

The DAC 20 of FIG. 2 is particularly immune to component non-linearities. For example, the capacitor 28 of the DAC 20, the resistor 26 and the ON resistance of the switches 22 and 24 may have highly non-linear behavior and yet not adversely affect the performance of the circuit 10 (FIG. 1). This is because for a given reference voltage the DAC 20 always discharges from a time static voltage value to ground. As long as the values of the components follow the same non-linear behavior function for a given reference voltage from cycle to cycle, the performance of the DAC 20 will be unaffected by the component non-linearities.

Consequently, for a CT Delta-Sigma modulator that uses the inventive circuit of FIG. 2 or FIG. 3, the only source of transients in the feedback DAC is caused by the voltage spike of $V_{out}$ when the capacitor 28 is discharged through the resistor 26. Because only the integral of the signal waveform of $V_{out}$ is significant, it is possible to reduce this transient by reducing the turn-on time of the $\Phi_2$ switch. If a slow RC circuit is used to round-off the square edges of $\Phi_2$, $V_{out}$ will rise quadratically and decay exponentially. With this waveform, the continuous-time amplifiers are not exposed to sharp transients except for those that are generated by the sampled signal. The sampled signal, however, is usually filtered. The turn-on time of the switch 22 may be reduced because the circuit is immune to static non-linearities.

By eliminating the transients from the feedback DAC, the signal settling can be improved, and thus, the required bandwidth of the integrator amplifiers can be correspondingly reduced. In turn, the circuit size and related circuit power consumption are also reduced. It should be noted that regardless of the value of the ON resistance of the switch 22, the time integral shall remain constant. This is because the charge deposited on the capacitor 28 is constant for a given reference voltage. Thus, the integral of the current passed through the resistor 26 is also constant because it is equal to the charge stored by the capacitor 28. Therefore, as long as the resistance of resistor 26 remains constant the integral of $V_{out}$ will also remain constant regardless of the ON resistance of the switch controlled by the clock phase $\Phi_2$. Thus, numerous modifications may be made to the DACs 20 and 40 of FIGS. 2 and 3, respectively, without departing from the scope of the present inventive method and apparatus. Thus, it is to be understood that the invention is not to be limited by the specific illustrated embodiments, but only by the scope of the appended claims.

What is claimed is:

1. A digital-to-analog converter for generating an analog signal V as a function of a received digital signal D, wherein the converter receives a clock signal having a first and a second phase and wherein the converter has a ground, the converter comprising:
    a) a capacitor coupled to the ground;
    b) a first two-position switch coupled to the capacitor, the first switch receiving an analog reference signal that is generated as a function of the digital signal and wherein the capacitor is charged with the analog reference signal during the first phase of the clock signal; and
    c) a second two-position switch coupled to the capacitor, the second switch generating the analog signal V by discharging the capacitor during the second phase of the clock signal;
    wherein the first phase and second phase of the clock are each long enough to ensure that minor variations in the clock cycle have a minimal effect on the integral of a voltage across the capacitor taken over the second phase of the clock.

2. The converter according to claim 1, further comprising a resistor coupled to the second switch and to a ground, and wherein the capacitor is discharged across the resistor during the second phase of the clock signal.

3. The converter according to claim 1, further comprising a transconductor coupled to the second switch and wherein the capacitor is discharged across the transconductor during the second phase of the clock signal.

4. The converter according to claim 2, further comprising a dipole switch coupled to the first switch, the dipole switch receiving a first analog level signal and a second analog level signal and supplying one of the first and the second analog level signals as the analog reference signal to the first switch based on the value of the digital signal D.

5. The converter according to claim 3, further comprising a dipole switch coupled to the first switch, the dipole switch receiving a first analog level signal and a second analog level signal and supplying one of the first and the second analog level signals as the analog reference signal to the first switch based on the value of the digital signal D.

6. The converter according to claim 4, wherein the first analog level signal, the second analog level signal, and the analog reference signal are voltage signals.

7. The converter according to claim 5, wherein the first analog level signal, the second analog level signal, and the analog reference signal are voltage signals.

8. The converter according to claim 6, wherein the digital signal D is a single bit binary signal having two values and wherein the magnitude of the first analog level signal is equal to the magnitude of the second analog level signal.

9. The converter according to claim 7, wherein the digital signal D is a single bit binary signal having two values and wherein the magnitude of the first analog level signal is equal to the magnitude of the second analog level signal.

10. A continuous-time, Delta-Sigma, analog-to-digital converter for generating a digital signal, D as a function of an analog signal, U, wherein the converter receives a clock signal having a first and a second phase, and wherein the converter has a ground, the converter comprising:
    a) a loop filter receiving the analog signal U and an analog feedback signal V and generating an analog difference signal Y where the difference signal Y is equal to the difference between the analog signal U and the analog feedback signal V; and
    b) a quantizer receiving the analog difference signal Y and generating the digital signal D as a function of the analog difference signal Y, the quantizer including:
        i) a capacitor coupled to the ground;
        ii) a first two-position switch coupled to the capacitor, the first switch receiving an analog reference signal that is generated as a function of the digital signal and wherein the capacitor is charged with the analog reference signal during the first phase of the clock signal; and
        iii) a second two-position switch coupled to the capacitor, the second switch generating the analog feedback signal V by coupling the capacitor to the loop filter and generating a discharge path for the capacitor during the second phase of the clock signal;
    wherein the first phase and second phase of the clock are each long enough to ensure that minor variations in the clock cycle have a minimal effect on the integral of a voltage across the capacitor taken over the second phase of the clock.

11. The converter according to claim 10, the quantizer further including a resistor coupled to the second switch and to a ground, and wherein the capacitor is discharged across the resistor during the second phase of the clock signal.

12. The converter according to claim 10, the quantizer further including a transconductor coupled to the second switch and wherein the capacitor is discharged across the transconductor during the second phase of the clock signal.

13. The converter according to claim 11, the quantizer further comprising a dipole switch coupled to the first switch, the dipole switch receiving a first analog level signal and a second analog level signal and supplying one of the first and the second analog level signals as the analog reference signal to the first switch based on the value of the digital signal D.

14. The converter according to claim 12, the quantizer further comprising a dipole switch coupled to the first switch, the dipole switch receiving a first analog level signal and a second analog level signal and supplying one of the first and the second analog level signals as the analog reference signal to the first switch based on the value of the digital signal D.

15. The converter according to claim 13, wherein the first analog level signal, the second analog level signal, and the analog reference signal are voltage signals.

16. The converter according to claim 14, wherein the first analog level signal, the second analog level signal, and the analog reference signal are voltage signals.

17. The converter according to claim 15, wherein the digital signal D is a single bit binary signal having two values and wherein the magnitude of the first analog level signal is equal to the magnitude of the second analog level signal.

18. The converter according to claim 16, wherein the digital signal D is a single bit binary signal having two values and wherein the magnitude of the first analog level signal is equal to the magnitude of the second analog level signal.

19. The converter according to claim 17, wherein the loop filter includes at least one integrator, the at least one integrator receiving the analog feedback signal V.

20. The converter according to claim 18, wherein the loop filter includes at least one integrator, the at least one integrator receiving the analog feedback signal V.

21. A method of generating an analog signal V as a function of a received digital signal D and a clock signal having a first and a second phase, the method comprising the steps of:

a) generating an analog reference signal as a function of the digital signal D;

b) charging a capacitor with the analog reference signal during the first phase of the clock signal;

c) generating the analog signal V by discharging the capacitor during the second phase of the clock signal such that the capacitor is essentially fully charged before the end of each first clock phase and essentially fully discharged prior to the end of each second clock phase, making the integral of the analog signal V over the second phase of the clock constant for each cycle of the clock.

22. The method according to claim 21, wherein step c) comprises generating the analog signal V by discharging the capacitor across a resistor during the second phase of the clock signal.

23. The method according to claim 21, wherein step c) comprises generating the analog signal V by discharging the capacitor across a transconductor during the second phase of the clock signal.

24. The method according to claim 22, wherein step a) comprises receiving a first analog level signal and a second analog level signal and supplying one of the first and the second analog level signals as an analog reference signal based on the value of the digital signal D.

25. The method according to claim 23, wherein step a) comprises receiving a first analog level signal and a second analog level signal and supplying one of the first and the second analog level signals as an analog reference signal based on the value of the digital signal D.

26. The method according to claim 24, wherein the first analog level signal, the second analog level signal, and the analog reference signal are voltage signals.

27. The method according to claim 25, wherein the first analog level signal, the second analog level signal, and the analog reference signal are voltage signals.

28. The method according to claim 26, wherein the digital signal D is a single bit binary signal having two values and wherein the magnitude of the first analog level signal is equal to the magnitude of the second analog level signal.

29. The method according to claim 27, wherein the digital signal D is a single bit binary signal having two values and wherein the magnitude of the first analog level signal is equal to the magnitude of the second analog level signal.

30. A method for generating a digital signal, D as a function of an analog signal, U and a clock signal having a first and a second phase, the method comprising the steps of:

a) receiving the analog signal U and an analog feedback signal V and generating an analog difference signal Y where the difference signal Y is equal to the difference between the analog signal U and the analog feedback signal V;

b) receiving the analog difference signal Y and generating the digital signal D as a function of the analog difference signal Y;

c) generating an analog reference signal as a function of the digital signal D;

d) charging a capacitor with the analog reference signal during the first phase of the clock signal; and e) generating the analog feedback signal V by discharging the capacitor during the second phase of the clock signal such that the capacitor is essentially fully charged before the end of each first clock phase and essentially fully discharged prior to the end of each second clock phase, making the integral of the analog signal V over the second phase of the clock constant for each cycle of the clock.

31. The method according to claim 30, wherein step e) comprises generating the analog feedback signal V by discharging the capacitor across a resistor during the second phase of the clock signal.

32. The method according to claim 30, wherein step e) comprises generating the analog feedback signal V by discharging the capacitor across a transconductor during the second phase of the clock signal.

33. The method according to claim 31, wherein step c) comprises receiving a first analog level signal and a second analog level signal and supplying one of the first and the second analog level signals as an analog reference signal based on the value of the digital signal D.

34. The method according to claim 32, wherein step c) comprises receiving a first analog level signal and a second analog level signal and supplying one of the first and the second analog level signals as an analog reference signal based on the value of the digital signal D.

35. The method according to claim 33, wherein the first analog level signal, the second analog level signal, and the analog reference signal are voltage signals.

36. The method according to claim 34, wherein the first analog level signal, the second analog level signal, and the analog reference signal are voltage signals.

37. The method according to claim 35, wherein the digital signal D is a single bit binary signal having two values and wherein the magnitude of the first analog level signal is equal to the magnitude of the second analog level signal.

38. The method according to claim 36, wherein the digital signal D is a single bit binary signal having two values and wherein the magnitude of the first analog level signal is equal to the magnitude of the second analog level signal.

39. A digital-to-analog converter for generating an analog signal V as a function of a received digital signal D, the converter receiving a clock signal having a first and a second phase, the converter comprising:

a) means for generating an analog reference signal as a function of the digital signal D;

b) means for charging a capacitor with the analog reference signal during the first phase of the clock signal; and c) means for generating the analog signal V by discharging the capacitor during the second phase of the clock signal such that the capacitor is essentially fully charged before the end of each first clock phase and essentially fully discharged prior to the end of each second clock phase, making the integral of the analog signal V over the second phase of the clock constant for each cycle of the clock.

40. A continuous-time, Delta-Sigma, analog-to-digital converter for generating a digital signal, D as a function of an analog signal, U, the converter receiving a clock signal having a first and a second phase, the converter comprising:

a) means for receiving the analog signal U and an analog feedback signal V and generating an analog difference signal Y where the difference signal Y is equal to the difference between the analog signal U and the analog feedback signal V;

b) means for receiving the analog difference signal Y and generating the digital signal D as a function of the analog difference signal Y;

c) means for generating an analog reference signal as a function of the digital signal D;
d) means for charging a capacitor with the analog reference signal during the first phase of the clock signal; and
e) means for generating the analog feedback signal V by discharging the capacitor during the second phase of the clock signal.

* * * * *